United States Patent
Jeon et al.

(10) Patent No.: US 8,399,882 B2
(45) Date of Patent: Mar. 19, 2013

(54) OXIDE SEMICONDUCTOR TRANSISTORS AND METHODS OF MANUFACTURING THE SAME

(75) Inventors: Sang-hun Jeon, Yongin-si (KR); I-hun Song, Seongnam-si (KR); Chang-jung Kim, Yongin-si (KR); Sung-ho Park, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 267 days.

(21) Appl. No.: 12/801,500

(22) Filed: Jun. 11, 2010

(65) Prior Publication Data
US 2011/0168993 A1   Jul. 14, 2011

(30) Foreign Application Priority Data
Jan. 8, 2010   (KR) .................. 10-2010-0001896

(51) Int. Cl.
*H01L 29/12* (2006.01)
(52) U.S. Cl. .................. 257/43; 438/166
(58) Field of Classification Search .................. 257/43, 257/76, 78, 79; 438/30, 166
See application file for complete search history.

(56) References Cited

U.S. PATENT DOCUMENTS
5,482,870 A   1/1996   Inoue
2003/0141505 A1*   7/2003   Isobe et al. .................. 257/66
2007/0278490 A1*   12/2007   Hirao et al. .................. 257/64
2009/0267225 A1*   10/2009   Eguchi .................. 257/729

FOREIGN PATENT DOCUMENTS

| | | |
|---|---|---|
| JP | 2001-352073 | 12/2001 |
| JP | 2007-220818 | 8/2007 |
| JP | 2009-135380 | 6/2009 |
| KR | 10-0349915 | 8/2002 |
| KR | 10-0810639 | 2/2008 |
| KR | 10-0847846 | 7/2008 |

OTHER PUBLICATIONS

Shigemi Kohiki et al., "Enhanced electrical conductivity of zinc oxide thin films by ion implantation of gallium, aluminum, and boron atoms," Journal of Applied Physics, 75, 2069 (1994); doi: 10. 1063/1.356310.

* cited by examiner

*Primary Examiner* — Thomas L Dickey
(74) *Attorney, Agent, or Firm* — Harness, Dickey & Pierce, P.L.C.

(57) ABSTRACT

Transistors and methods of manufacturing the same. A transistor may be an oxide thin film transistor (TFT) with a self-aligned top gate structure. The transistor may include a gate insulating layer between a channel region and a gate electrode that extends from two sides of the gate electrode. The gate insulating layer may cover at least a portion of source and drain regions.

20 Claims, 10 Drawing Sheets

OXIDE SEMICONDUCTOR TRANSISTORS AND METHODS OF MANUFACTURING THE SAME

CROSS-REFERENCE TO RELATED APPLICATION

This application claims priority under 35 U.S.C. §119 to Korean Patent Application No. 10-2010-0001896, filed on Jan. 8, 2010, in the Korean Intellectual Property Office (KIPO), the entire contents of which is incorporated herein reference.

BACKGROUND

1. Field

Example embodiments relate to transistors and methods of manufacturing the same.

2. Description of the Related Art

A transistor is widely used as a switching device or a driving device in electronic devices. In particular, a thin film transistor (TFT) may be formed on a glass substrate or a plastic substrate and is generally used in flat panel display devices such as liquid crystal display devices, organic light emitting display devices or the like.

Most commercialized flat panel display devices and other various electronic devices use TFTs having a channel layer formed of amorphous silicon or polycrystalline silicon. However, in silicon-based TFTs the carrier mobility of a channel layer may be low, a manufacturing process may be complicated, and a high temperature process may be required.

Thin film transistors generally have a structure in which a source and a drain partially overlap a gate. Parasitic capacitance may occur due to the overlapping portions between the gate and the source/drain and an operating speed may be reduced. If the gate and the source/drain do not overlap, a parasitic resistive region may occur and characteristics of a transistor may be deteriorated.

SUMMARY

Example embodiments may provide transistors including an oxide semiconductor layer as a channel layer and methods of manufacturing the same.

According to example embodiments, a transistor may include an oxide semiconductor layer having source and drain regions, and a channel region formed between the source and drain regions, a gate electrode formed on the channel region and a gate insulating layer formed between the channel region and the gate electrode and extending onto the source and drain regions which are disposed on both sides of the gate electrode.

According to example embodiments, a transistor may include an oxide semiconductor layer including a source region, a drain region and a channel region, the channel region between the source and drain regions, a gate electrode on the channel region and a gate insulating layer between the channel region and the gate electrode, the gate insulating layer on the source region, the drain region and the channel region.

The oxide semiconductor layer may include one selected from the group consisting of ZnO, SnO, InO, CdO, SrO, CuO, AlO, GaO, HfO, ZrO, NbO, SmO, GdO, DyO, BaO, TiO, CaO, TaO, LnO, NiO, YO and mixtures thereof, or oxides based thereon. The oxide semiconductor layer may be formed of a ZnO-based oxide. The ZnO-based oxide may include at least one selected from the group consisting of indium (In), gallium (Ga), aluminum (Al), titanium (Ti), tin (Sn), zirconium (Zr), hafnium (Hf), yttrium (Y), tantalum (Ta) and chromium (Cr). The source and drain regions may be regions into which a conductive impurity is injected.

The conductive impurity may include at least one selected from the group consisting of boron (B), boron difluoride (BF), aluminum (Al), gallium (Ga), indium (In) and antimony (Sb). The transistor may further include insulating spacers formed on two side surfaces of the gate electrode and on the gate insulating layer. The transistor may further include an interlayer insulating layer covering the oxide semiconductor layer, the gate insulating layer and the gate electrode and first and second electrode layers formed on the interlayer insulating layer and respectively connected to the source and drain regions. The transistor may further include a first electrode layer directly contacting the source region and a second electrode layer directly contacting the drain region.

According to example embodiments, methods of manufacturing transistors may include forming an oxide semiconductor layer having a region to be a channel, forming a gate insulating layer on the oxide semiconductor layer, forming a conductive layer to cover the gate insulating layer, patterning the conductive layer so as to form a gate electrode corresponding to the region to be a channel and to expose portions of the gate insulating layer at both sides of the gate electrode, and forming source and drain regions in the oxide semiconductor layer at both sides of the gate electrode while the gate insulating layer is remained at the both sides of the gate electrode.

According to example embodiments, methods of manufacturing transistors may include forming an oxide semiconductor layer including a channel region, forming a gate insulating layer on the oxide semiconductor layer, forming a conductive layer on the gate insulating layer, patterning the conductive layer to form a gate electrode corresponding to the channel region and to expose the gate insulating layer adjacent to the gate electrode and forming source and drain regions in the oxide semiconductor layer adjacent to the gate electrode.

The method may further include forming insulating spacers on two side surfaces of the gate electrode. In this case, the method may further include etching the gate insulating layer by using the gate electrode and the insulating spacers as an etching mask. The oxide semiconductor layer may include one selected from the group consisting of ZnO, SnO, InO, CdO, SrO, CuO, AlO, GaO, HfO, ZrO, NbO, SmO, GdO, DyO, BaO, TiO, CaO, TaO, LnO, NiO, YO and mixtures thereof, or oxides based thereon. The oxide semiconductor layer may be formed of a ZnO-based oxide. The ZnO-based oxide may further include at least one selected from the group consisting of indium (In), gallium (Ga), aluminum (Al), titanium (Ti), tin (Sn), zirconium (Zr), hafnium (Hf), yttrium (Y), tantalum (Ta) and chromium (Cr).

The forming of the source and drain regions may include injecting a conductive impurity into the oxide semiconductor layer at the both sides of the gate electrode. The conductive impurity may include at least one selected from the group consisting of boron (B), boron difluoride ($BF_2$), aluminum (Al), gallium (Ga), indium (In) and antimony (Sb). The forming of the source and drain regions may further include annealing the oxide semiconductor layer into which the conductive impurity is injected. The annealing may be performed at a temperature equal to or lower than about 400° C.

BRIEF DESCRIPTION OF THE DRAWINGS

Example embodiments will be more clearly understood from the following brief description taken in conjunction with the accompanying drawings. FIGS. 1-10 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
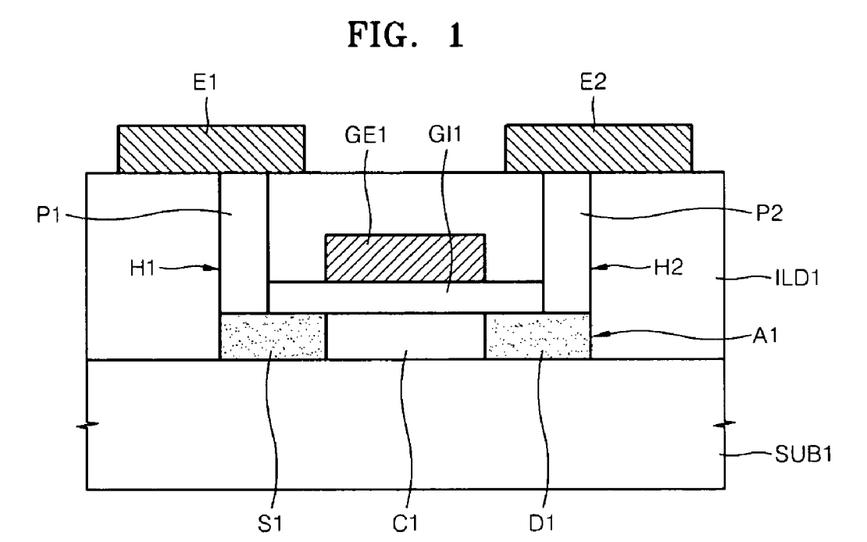
FIG. 1 is a cross-sectional diagram of a transistor according to example embodiments.

FIG. 1 is a cross-sectional diagram of a transistor according to example embodiments. Referring to FIG. 1, an active layer A1 may be on a substrate SUB1. The substrate SUB1 may be, for example, a glass substrate and/or may be one of various substrates generally used in a semiconductor device process (e.g., a plastic substrate and/or a silicon substrate). The active layer A1 may be an oxide semiconductor layer. For example, the active layer A1 may include at least one of ZnO, SnO, InO, CdO, SrO, CuO, AlO, GaO, HfO, ZrO, NbO, SmO, GdO, DyO, BaO, TiO, CaO, TaO, LnO, NiO, YO and mixtures thereof, and/or oxide semiconductors based thereon. If the active layer A1 is, for example, a ZnO-based oxide semiconductor, the active layer A1 may further include at least one of Group III elements such as indium (In), gallium (Ga) and aluminum (Al), Group IV elements such as titanium (Ti), tin (Sn), zirconium (Zr) and hafnium (Hf), and other elements such as yttrium (Y), tantalum (Ta) and chromium (Cr). The active layer A1 may be amorphous or crystalline, or a mixture of amorphous and crystalline. The active layer A1 may be at least one of a monolayer and a multilayer structure. Although not shown in FIG. 1, an insulating layer may be between the substrate SUB1 and the active layer A1. The insulating layer may be on the substrate SUB1 and then the active layer A1 may be on the insulating layer.

The active layer A1 may have a channel region C1. Source and drain regions S1 and D1 may be at sides of the channel region C1. The source and drain regions S1 and D1 may be regions into which a conductive impurity is injected. For example, the conductive impurity may include at least one of boron (B), boron difluoride ($BF_2$), aluminum (Al), gallium (Ga), indium (In) and/or antimony (Sb). The conductive impurity may be injected at a dose of, for example, about $10^{13}/cm^2$ to about $10^{17}/cm^2$. The source and drain regions S1 and D1 may have a low resistance. For example, the source and drain regions S1 and D1 may have a resistance of, for example, about $10^{-4}$ Ω·cm to about $10^{-1}$ Ω·cm. The source and drain regions S1 and D1 may have a carrier density of, for example, about $10^{17}/cm^3$ to about $10^{21}/cm^3$.

A gate electrode GE1 may be on the channel region C1. The gate electrode GE1 may have a width corresponding to that of the channel region C1. The gate electrode GE1 may include a metal such as copper (Cu), titanium (Ti), molybdenum (Mo), aluminum (Al), nickel (Ni), tungsten (W), platinum (Pt) and/or chromium (Cr), and/or a conductive oxide such as indium zinc oxide (IZO) and/or indium tin oxide (ITO). The gate electrode GE1 may include an alloy of at least two metals. The gate electrode GE1 may be at least one of a monolayer structure and a multilayer structure including a plurality of different material layers.

A gate insulating layer GI1 may be between the active layer A1 and the gate electrode GE1. The gate insulating layer GI1 may have a width greater than that of the gate electrode GE1 and may extend on the source and drain regions S1 and D1. The gate insulating layer GI1 may extend from both sides of the channel region C1 so as to cover at least portions of the source and drain regions S1 and D1. Although not shown in FIG. 1, the gate insulating layer GI1 may also be on side surfaces of the active layer A1 and an upper surface of the substrate SUB1, onto which the active layer A1 does not extend. The gate insulating layer GI1 may be, for example, a silicon oxide layer, a silicon nitride layer and/or a high-k material layer having a higher dielectric constant than a silicon nitride layer. The gate insulating layer GI1 may be a multilayer structure including at least two of a silicon oxide layer, a silicon nitride layer and a high-k material layer. If the gate insulating layer GI1 includes a high-k material, a short channel effect of the transistor may be suppressed. In order to scale down the transistor, the gate insulating layer GI1 may be a high-k material.

An interlayer insulating layer ILD1 may be on the substrate SUB1 so as to, for example, cover the active layer A1, the gate insulating layer GI1 and the gate electrode GE1. First and second electrodes E1 and E2, electrically connected to the source and drain regions S1 and D1, may be on the interlayer insulating layer ILD1. The source region S1 and the first electrode E1 may be connected via a first conductive plug P1. The drain region D1 and the second electrode E2 may be connected via a second conductive plug P2. The first electrode E1 may be a source electrode and the second electrode E2 may be a drain electrode. The first electrode E1 and the first conductive plug P1 may be integrally formed and the second electrode E2 and the second conductive plug P2 may be integrally formed. Reference characters H1 and H2 respectively represent first and second contact holes through which the first and second conductive plugs P1 and P2 pass. A passivation layer (not shown) may be on the interlayer insulating layer ILD1 so as to, for example, cover the first and second electrodes E1 and E2.

A transistor according to example embodiments may have a self-aligned top gate structure in which the source and drain regions S1 and D1 do not overlap the gate electrode GE1. In this structure, parasitic capacitance may be minimized and/or reduced, a cut-off frequency may be increased, and the operation speed of the transistor may be increased. Because an oxide semiconductor layer used as the active layer A1 has a higher charge mobility than that of an amorphous silicon layer or a polycrystalline silicon layer, an electronic device having a high operation speed may be realized by using the transistor according to example embodiments. Unlike a polycrystalline silicon layer, the oxide semiconductor layer may have uniform electrical properties over the whole surface of the substrate SUB1 and may be used to realize a large-area display device. If the oxide semiconductor layer is used as a channel layer, a crystallization process and/or a dehydrogenation process may not be needed to form the channel layer, a manufacturing process may be simplified and a manufacturing cost may be reduced.

If the gate insulating layer GI1 extends from both sides of the gate electrode GE1 as illustrated in FIG. 1, deterioration in characteristics of the transistor due to etch damage of the gate insulating layer GI1 may be prevented and/or reduced.

Figure 2:
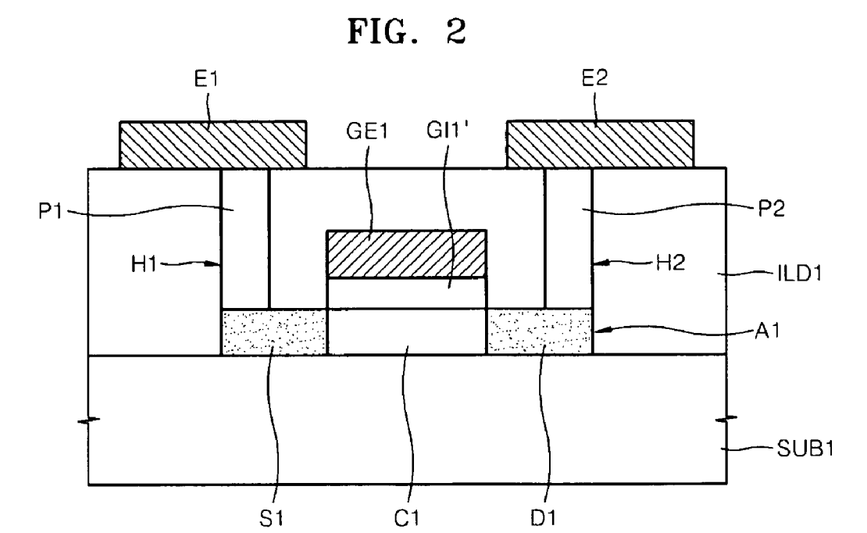
FIG. 2 is a cross-sectional diagram of a transistor according to a comparative example.

FIG. 2 is a cross-sectional diagram of a transistor according to a comparative example. As illustrated in FIG. 2, if a gate insulating layer GI1' and a gate electrode GE1 have the same width, side portions of the gate insulating layer GI1' may be etch-damaged and characteristics of the transistor may deteriorate. In FIG. 2, etch-damaged portions of the gate insulating layer GI1' (e.g., side portions) may exist between two ends of the gate electrode GE1 and the channel region C1. The etch-damaged portions of the gate insulating layer may directly influence characteristics of the transistor. For example, due to the etch-damaged portions of the gate insulating layer GI1', a leakage current through the gate insulating layer GI1' may be increased and a breakdown voltage of the gate insulating layer may be lowered. Various problems may occur. These problems may occur when the gate insulating layer GI1' is a silicon oxide layer and/or a silicon nitride layer and may have a greater impact when the gate insulating layer GI1' is a high-k material layer. The problems may be more serious as the gate insulating layer GI1' is thinner. As illustrated in FIG. 2, if the gate insulating layer GI1' and the gate electrode GE1 have the same width, the transistor may exhibit a deterioration in characteristics and may not be easily scaled down.

As illustrated in FIG. 1, if the gate insulating layer GI1 extends from both sides of the gate electrode GE1, the gate insulating layer GI1 located between the gate electrode GE1 and the channel region C1 may not be etch-damaged. Deterioration in characteristics of the transistor due to etch damage may be prevented and/or reduced. The gate insulating layer GI1 may be easily formed by using a high-k material as well as a low-k material. The structure of FIG. 1 may improve characteristics of the transistor and may facilitate scaling of a transistor. Because the source and drain regions S1 and D1 may have a low resistance in the structure of FIG. 1, a problem of a parasitic resistance may be prevented and/or reduced. Deterioration in characteristics of the transistor due to a parasitic resistance may also be suppressed and/or reduced.

Figure 3:
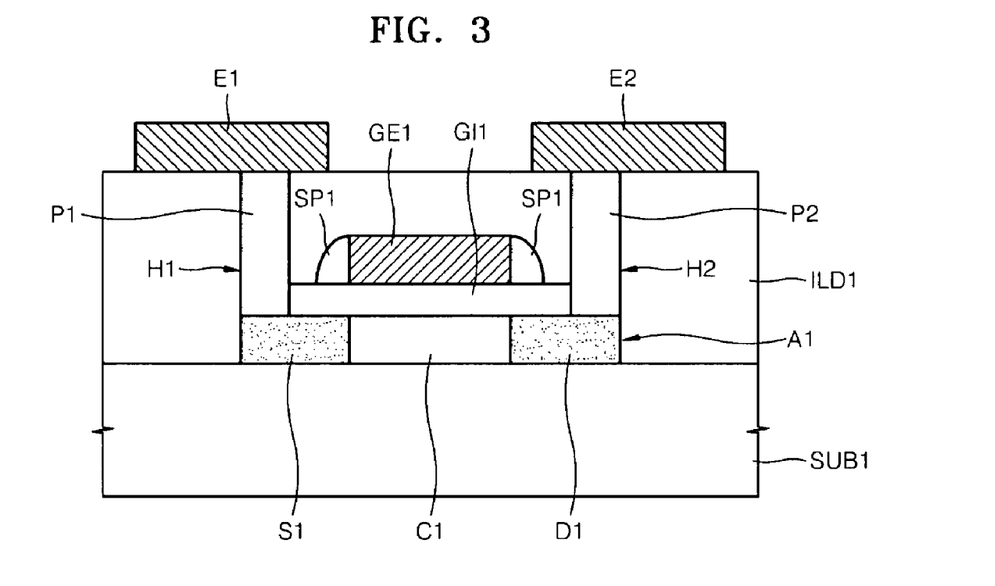
FIGS. 3-5 are cross-sectional diagrams of transistors according to example embodiments.
Figure 4:
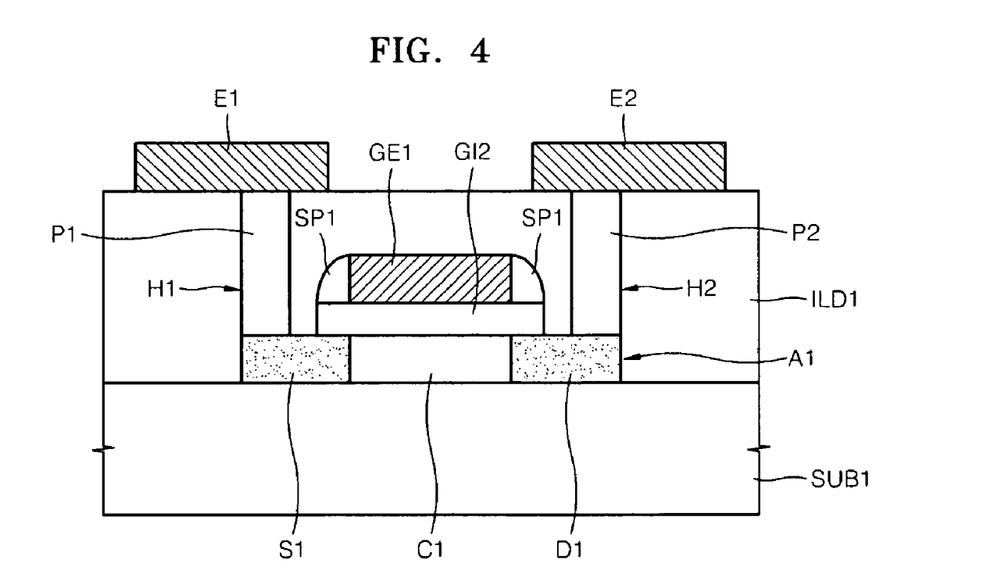
Figure 5:
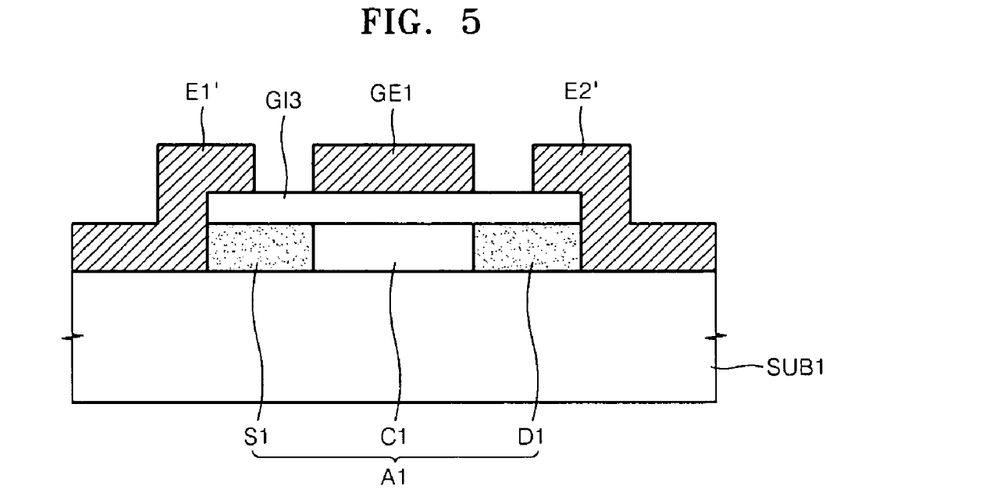

Example embodiments are not limited to the structure illustrated in FIG. 1 and variations in form and detail are contemplated. For example, FIGS. 3-5 are cross-sectional diagrams of transistors according to example embodiments. As illustrated in FIG. 3, insulating spacers SP1 may be on, for example, side surfaces of the gate electrode GE1. One having ordinary skill in the art understands that a transistor is 3-dimensional and the spacer may surround the gate electrode GE1 (e.g., an insulating spacer on a single surface of the gate electrode GE1). As illustrated in FIG. 4, portions of the gate insulating layer GI1, which are illustrated as being at two sides of a gate structure including the gate electrode GE1 and the insulating spacers SP1, may not be present as compared to the structure illustrated in FIG. 3.

Referring to FIG. 4, the gate insulating layer GI2 may extend to ends of the insulating spacers SP1 at two sides of the gate electrode GE1. The gate insulating layer GI2 may have a width corresponding to that of the gate structure including the gate electrode GE1 and the insulating spacers SP1. Except that the width of the gate insulating layer GI2 is reduced, the structure illustrated in FIG. 4 may be identical to that of the structure illustrated in FIG. 3. In FIGS. 3 and 4, the gate insulating layers GI1 and GI2 may extend from a side of the gate electrode GE1 and the gate insulating layer GI1 and GI2 located between the gate electrode GE1 and the channel region C1 may not be etch-damaged.

Referring to FIGS. 1, 3 and 4, first and second electrodes E1 and E2 may be on the interlayer insulating layer ILD1, and connected to the source and drain regions S1 and D1 via the first and second conductive plugs P1 and P2. Example embodiments are not limited thereto. Structures of the first and second electrodes E1 and E2 and connections between the first and second electrodes E1 and E2 and the source and drain regions S1 and D1 may vary in form and detail according to example embodiments. For example, referring to FIG. 5, first and second electrodes E1' and E2' having a layer structure may directly contact the source and drain regions S1 and D1. The first electrode E1' may contact a side surface of the source region S1 and the second electrode E2' may contact a side surface of the drain region D1. A gate insulating layer GI3 may cover the whole upper surface of the active layer A1. The first and second electrodes E1' and E2' may extend onto two ends of an upper surface of the gate insulating layer GI3.

According to example embodiments, two ends of the upper surface of the active layer A1 may not be covered by the gate insulating layer GI3. The gate insulating layer GI3 may have a width greater than that of the gate electrode GE1 and less than that of the active layer A1. Outer portions of the source and drain regions S1 and D1 may not be covered by the gate insulating layer GI3, and the first and second electrodes E1' and E2' may respectively contact upper surfaces of the source and drain regions S1 and D1. This type of structure may be similar to a structure obtained by applying the first and second electrodes E1' and E2' illustrated in FIG. 5 to the structure of FIG. 1. Although not shown in FIGS. 3 and 4, the first and second electrodes E1' and E2' illustrated in FIG. 5 may also be applied to the structures of FIGS. 3 and 4.

Figure 6A:
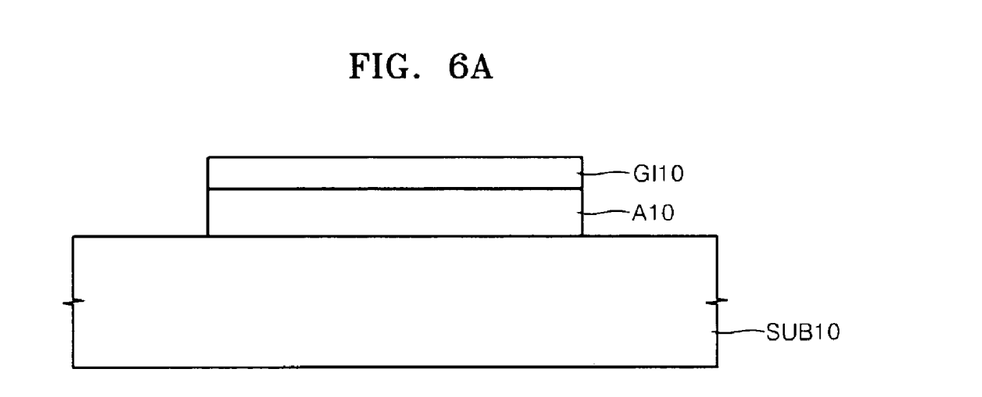
FIGS. 6A-6H are cross-sectional diagrams illustrating methods of manufacturing transistors according to example embodiments.
Figure 6B:
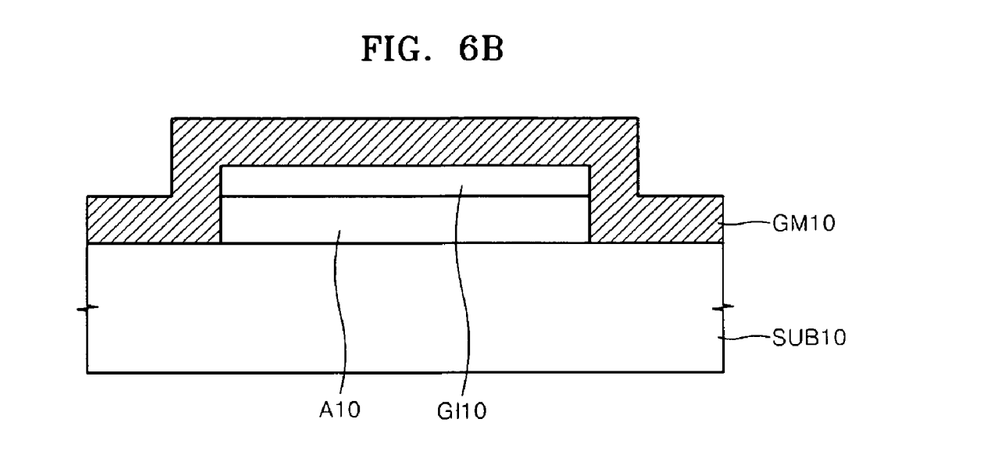
Figure 6C:
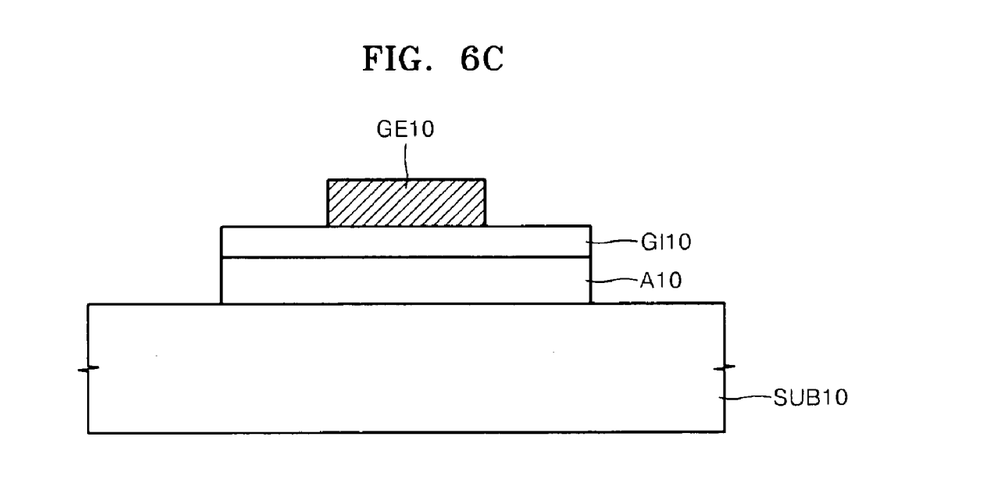

FIGS. 6A-6H are cross-sectional diagrams illustrating methods of manufacturing transistors according to example embodiments. Referring to FIG. 6A, a sequentially stacked structure including an active layer A10 and a gate insulating layer GI10 may be formed on a substrate SUB10. For example, the active layer A10 and the gate insulating layer GI10 may be formed by sequentially depositing a first material layer for forming the active layer A10 and a second material layer for forming the gate insulating layer GI10, and patterning the first and second material layers (e.g., together). The active layer A10 and the gate insulating layer GI10 may have the same width. However, example embodiments are not limited thereto. FIG. 7 is a cross-sectional diagram illustrating methods of manufacturing transistors according to example embodiments. According to example embodiments illustrated in FIG. 7, the gate insulating layer GI11 may be formed on the surface of the substrate SUB10 to cover the active layer A10. Although the gate insulating layer GI11 may be formed as described above, other processes may be the same as processes illustrated in FIGS. 6B-6H.

Referring to FIG. 6A, materials for forming the substrate SUB10, the active layer A10 and the gate insulating layer GI10 may be the same as described above in relation to FIG. 1 with respect to SUB1, A1 and GI1. The substrate SUB10 may be a glass substrate and/or may be one of various substrates generally used in a semiconductor device process (e.g., a plastic substrate and/or a silicon substrate). The active layer A10 may be an oxide semiconductor layer. For example, the active layer A10 may include at least one of ZnO, SnO, InO, CdO, SrO, CuO, AlO, GaO, HfO, ZrO, NbO, SmO, GdO, DyO, BaO, TiO, CaO, TaO, LnO, NiO, YO and mixtures thereof, and/or oxide semiconductors based thereon. If the active layer A10 is formed of, for example, a ZnO-based oxide semiconductor, the active layer A10 may further include at least one of Group III elements such as In, Ga and/or Al, Group IV elements such as Ti, Sn, Zr and/or Hf, and/or other elements such as Y, Ta and/or Cr.

The active layer A10 may be amorphous or crystalline, or a mixture of amorphous and crystalline. The active layer A10 may be at least one of a monolayer and multilayer structure. The gate insulating layer GI10 may be formed of a silicon oxide, a silicon nitride and/or a high-k material having a higher dielectric constant than a silicon nitride. The gate insulating layer GI10 may be at least one of a monolayer and multilayer structure including at least one of the silicon oxide layer, the silicon nitride layer and/or the high-k material layer. Although not shown in FIG. 6A, an insulating layer may be formed between the substrate SUB10 and the active layer A10. The insulating layer may be on the substrate SUB10 and the active layer A10 and the gate insulating layer GI10 may be formed on the insulating layer. Referring to FIG. 6B, a conductive layer GM10 may be formed on the substrate SUB10 so as to cover the stacked structure of the active layer A10 and the gate insulating layer GI10. The conductive layer GM10 may be formed of a metal, for example, Cu, Ti, Mo, Al, Ni, W, Pt and/or Cr, a conductive oxide such as IZO and/or ITO, or an alloy including at least two metals. The conductive layer GM10 may be at least one of a monolayer and a multilayer structure. The conductive layer GM10 may be patterned, for example, as illustrated in FIG. 6C. A gate electrode GE10 may be formed. The gate electrode GE10 may correspond to a channel region (center portion) of active layer A1. Etching for forming the gate electrode GE10 may be selective with respect to the gate insulating layer GI10. The gate insulating layer GI10 may not be patterned together with the gate electrode GE10 and may remain unetched. Although example embodiments may be described with respect to etching, other processes are contemplated (e.g., ablation)

Figure 6D:
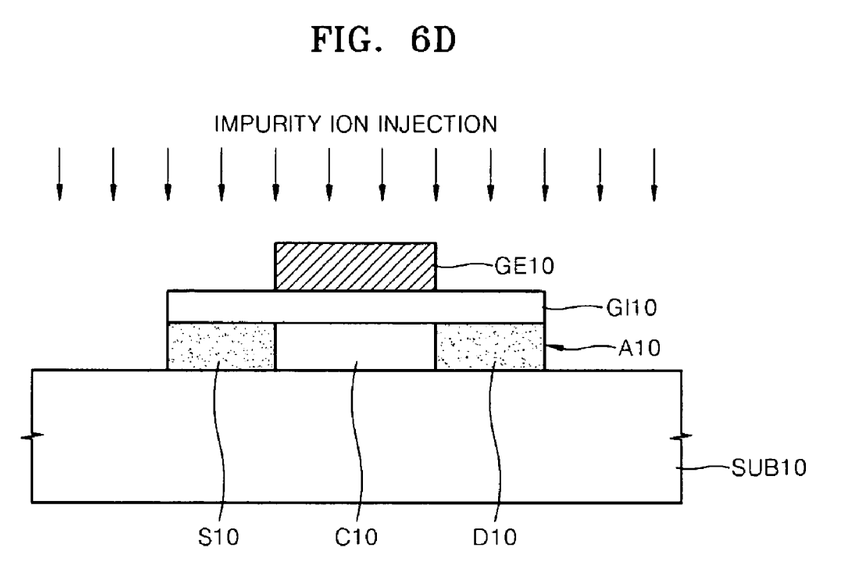
Figure 7:
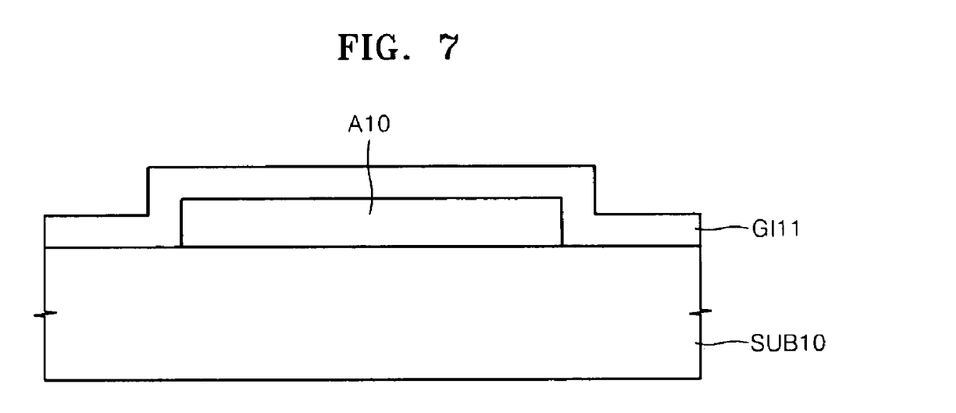
FIG. 7 is a cross-sectional diagram illustrating methods of manufacturing transistors according to example embodiments.

Referring to FIG. 6D, a conductive impurity may be injected into portions of the active layer A10 at sides of the gate electrode GE10 by using the gate electrode GE10 as an ion injection mask. For example, the conductive impurity may include at least one of B, $BF_2$, Al, Ga, In and Sb. The conductive impurity may be injected at a dose of, for example, about $10^{13}/cm^2$ to about $10^{17}/cm^2$. Source and drain regions S10 and D10 may be formed in the portions of the active layer A10 at both sides of the gate electrode GE10. When the conductive impurity is injected, the gate insulating layer GI10 at both sides of the gate electrode GE10 may function as a buffer layer for protecting the surface of the active layer A10. A portion of the active layer A1 between the source and drain regions S10 and D10 may be defined as a channel region C10. According to example embodiments, positions of the channel region C10 and the source and drain regions S10 and D10 may be determined by the gate electrode GE10.

Figure 6E:
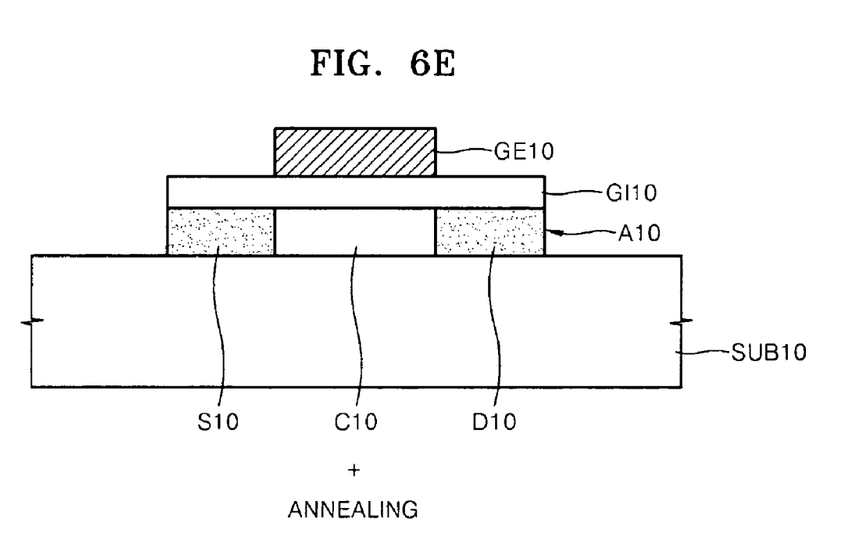

Referring to FIG. 6E, the active layer A10 may be annealed to activate the conductive impurity of the source and drain regions S10 and D10. The annealing may be performed at, for example, a temperature less than or equal to about 400° C. For example, an anneal temperature may be less than or equal to about 200° C. According to example embodiments, the conductive impurity of the source and drain regions S10 and D10 may be activated by performing annealing at a relatively low temperature. Even when the active layer A10 (e.g., an oxide semiconductor layer) is annealed at a temperature less than or equal to about 400° C., for example, less than or equal to about 200° C., after the conductive impurity is injected, the injected conductive impurity may be sufficiently activated. Low resistance source and drain regions S10 and D10 may be obtained. The source and drain regions S10 and D10 may have a resistance of, for example, about $10^{-4}$ Ω·cm to about $10^{-1}$ Ω·cm, and may have a carrier density of, for example, about $10^{17}/cm^3$ to about $10^{21}/cm^3$.

If an impurity is injected into a silicon layer, annealing may have to be performed at a high temperature greater than or equal to about 600~700° C. in order to activate the impurity. According to example embodiments, the active layer A10 may be formed of an oxide semiconductor and a conductive impurity (e.g., one or more conductive impurities) may be activated by performing low-temperature annealing. According to example embodiments, problems caused by high-temperature annealing may be prevented and/or reduced.

Figure 6F:
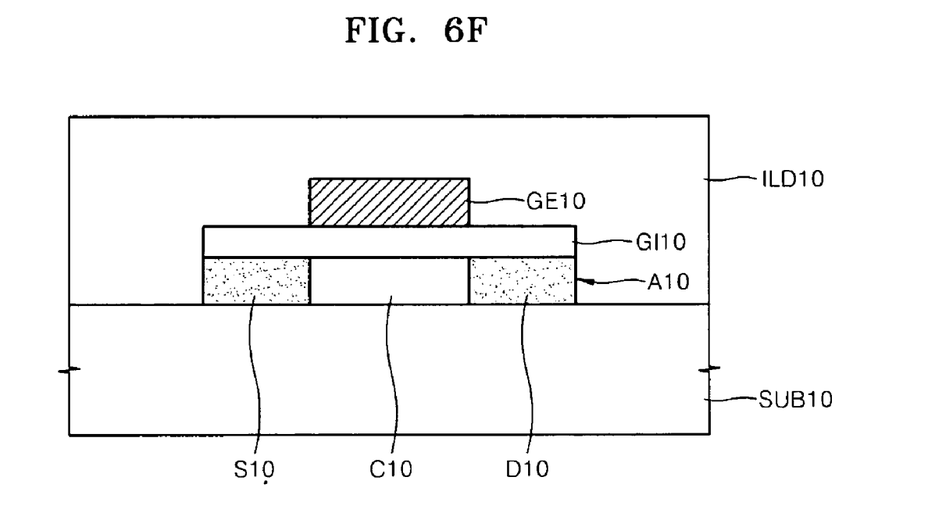
Figure 6G:
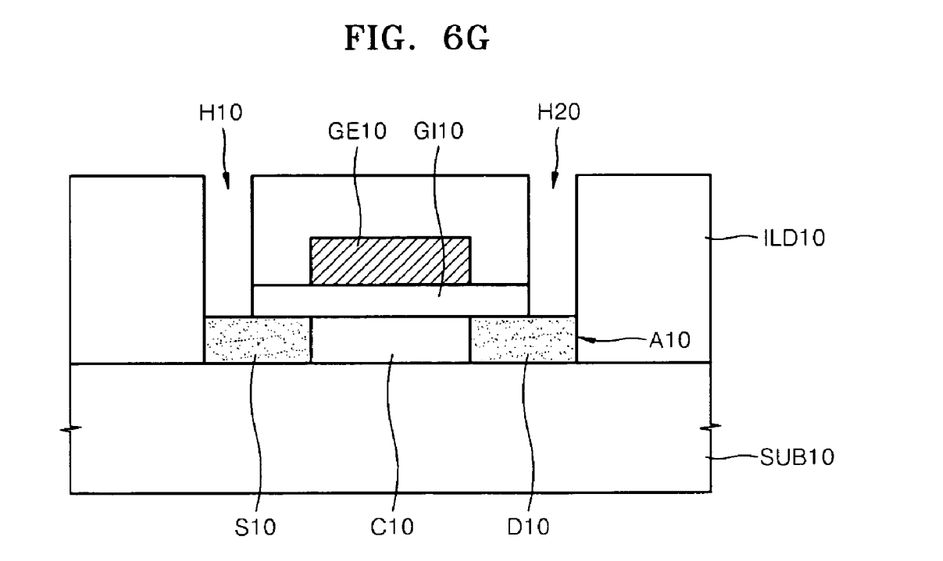

Referring to FIG. 6F, an interlayer insulating layer ILD10 may be formed to cover, for example, the active layer A10, the gate insulating layer GI10 and the gate electrode GE10. Referring to FIG. 6G, first and second contact holes H10 and H20 may be formed by, for example, etching the interlayer insulating layer ILD10 and the gate insulating layer GI10 so as to respectively expose the source and drain regions S10 and D10. The first and second contact holes H10 and H20 may expose side surfaces of the source and drain regions S10 and D10 in addition to upper surfaces (not shown).

Figure 6H:
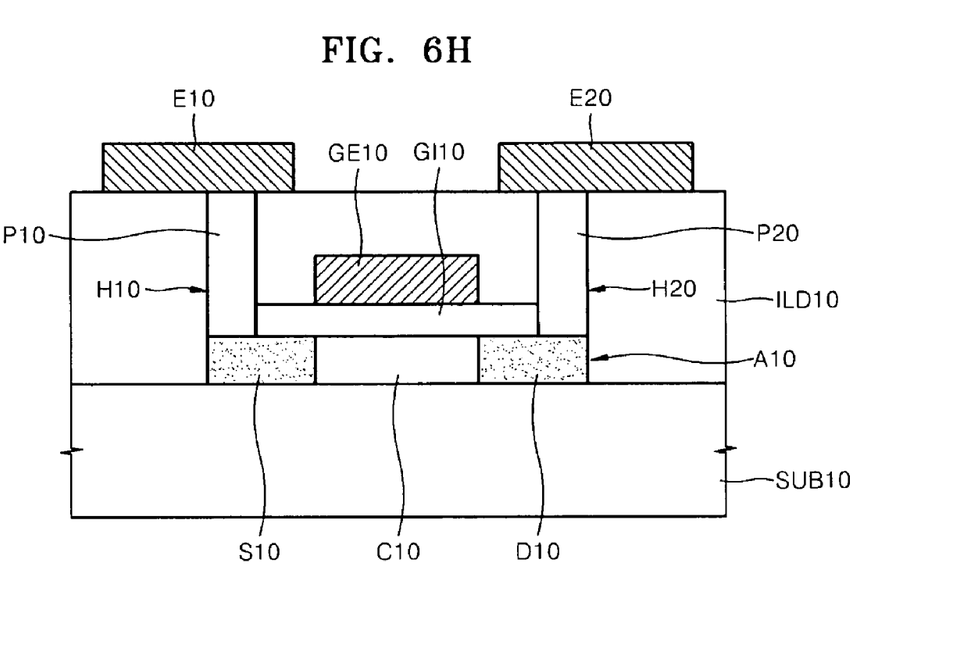

Referring to FIG. 6H, first and second conductive plugs P10 and P20 may be formed in the first and second contact holes H10 and H20. First electrode E10 and second electrode E20 may be formed on the interlayer insulating layer ILD10 so as to contact the first and second conductive plugs P10 and P20. The first conductive plug P10 and the first electrode E10 may be integrally formed and the second conductive plug P20 and the second electrode E20 may also be integrally formed. The first and second conductive plugs P10 and P20 and the first and second electrodes E10 and E20 may be simultaneously formed by forming a conductive layer to fill the first and second contact holes H10 and H20 and cover the interlayer insulating layer ILD10, and patterning the conductive layer.

A transistor according to example embodiments may have a self-aligned top gate structure in which positions of source and drain regions are automatically determined according to the position of a gate electrode. Because the transistor includes an oxide semiconductor layer as a channel layer, a crystallization process and/or a dehydrogenation process may not be needed to form the channel layer. Source and drain regions with a low resistance may be formed by performing low-temperature annealing. A manufacturing process may be simplified and a manufacturing cost may be reduced.

Figure 8A:
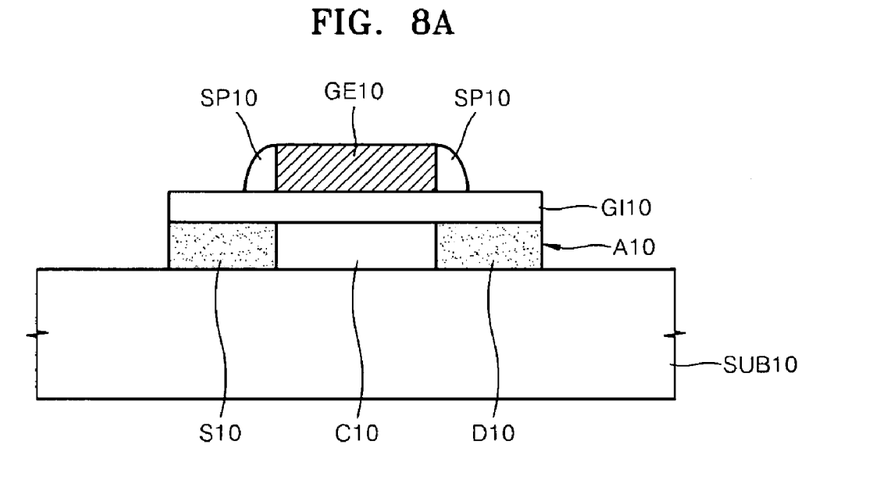
FIGS. 8A and 8B are cross-sectional diagrams illustrating methods of manufacturing transistors according to example embodiments.
Figure 8B:
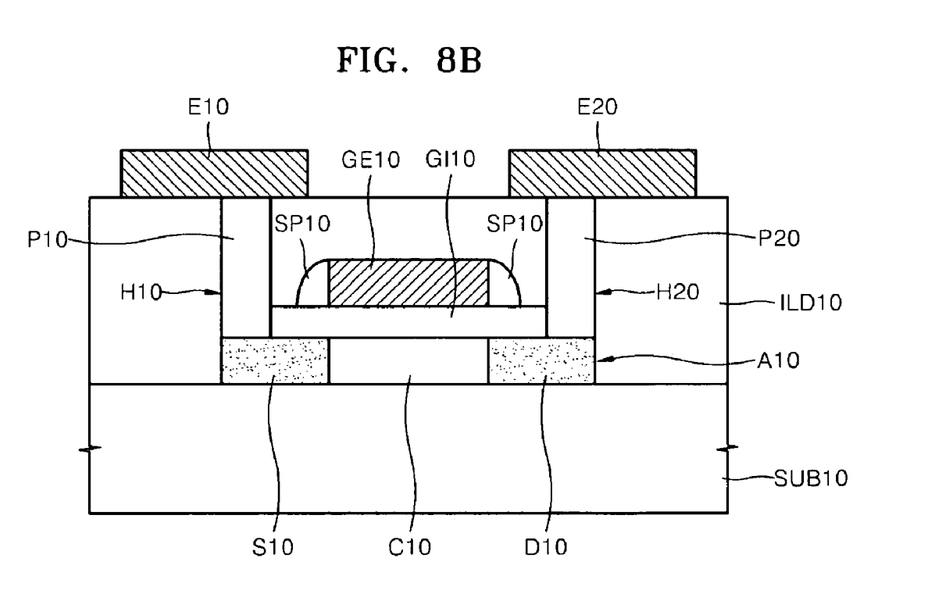
Figure 10:
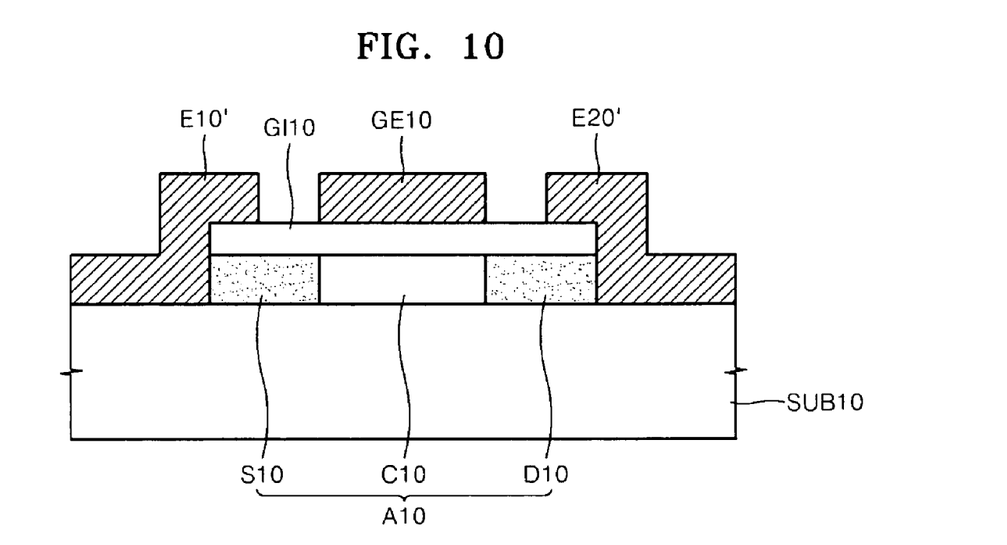
FIG. 10 is a cross-sectional diagram illustrating methods of manufacturing transistors according to example embodiments.

Example embodiments are not limited to the methods described with respect to FIGS. 6A-6H. FIGS. 8A and 10 are cross-sectional diagrams illustrating methods of manufacturing transistors according to example embodiments. As illustrated in FIG. 8A, insulating spacers SP10 may be formed on at least one side surface of the gate electrode GE10. If the processes of FIGS. 6E-6H are performed, the structure of FIG. 8B may be obtained. The structure of FIG. 8B may correspond to that of FIG. 3. The process of forming the insulating spacers SP10 in FIG. 8A may be performed, for example, after the annealing process of FIG. 6E and/or after the ion injection process of FIG. 6D.

Figure 9A:
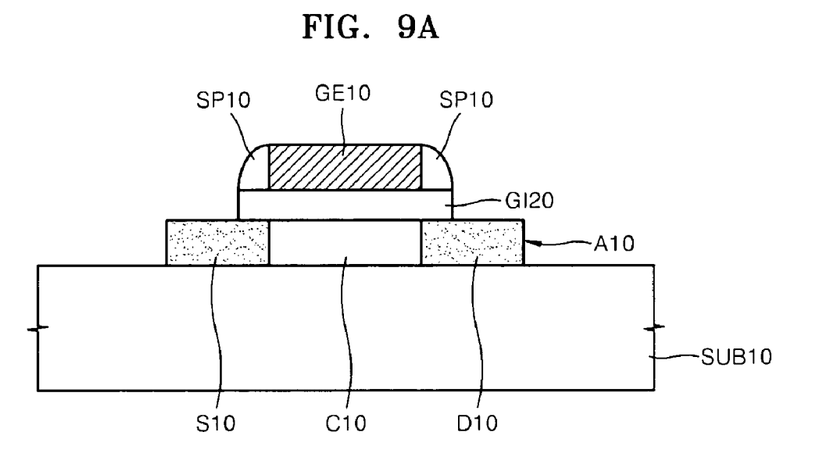
FIGS. 9A and 9B are cross-sectional diagrams illustrating methods of manufacturing transistors according to example embodiments.
Figure 9B:
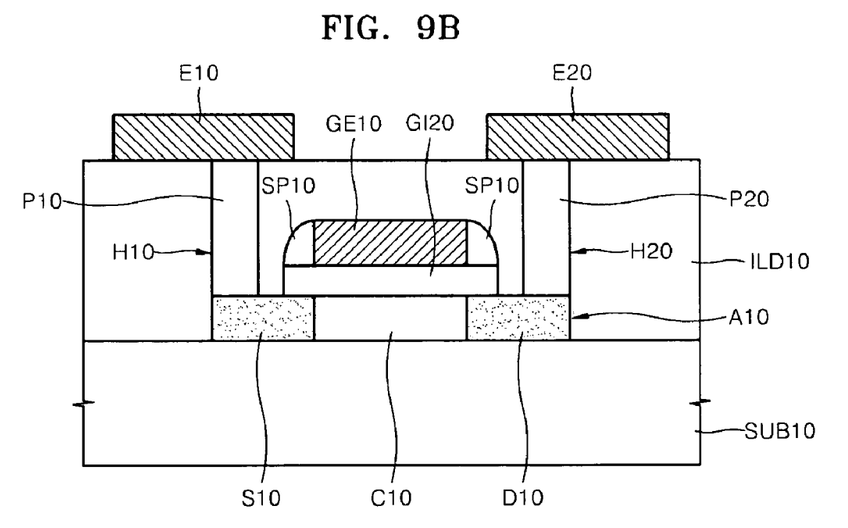

The gate insulating layer GI10 may be etched by using the gate electrode GE10 and the insulating spacers SP10 as an etching mask, as illustrated in FIG. 9A. For example, the gate insulating layer GI10 may be etched after the insulating spacers SP10 are formed as in FIG. 8A. A reference character GI20 in FIG. 9A may represent the etched gate insulating layer. If, for example, the processes of FIGS. 6E-6H are performed, the structure of FIG. 9B may be obtained. The structure of FIG. 9B may correspond to that of FIG. 4.

As illustrated in FIG. 10, first and second electrodes E10' and E20' may be formed to directly contact the source and drain regions S10 and D10. For example, first and second electrodes E10' and E20' may be formed after the annealing process of FIG. 6E is performed. The first and second electrodes E10' and E20' may be simultaneously or separately formed with or from the gate electrode GE10. The structure of FIG. 10 may correspond to that of FIG. 5. According to example embodiments, before the first and second electrodes E10' and E20' are formed in FIG. 10, two ends of the gate insulating layer GI10 may be etched to expose portions of upper surfaces of the source and drain regions S10 and D10 (not shown). The first and second electrodes E10' and E20' may contact the upper surfaces of the source and drain regions S10 and D10. As is understood by one having ordinary skill in the art, the timing and sequences of forming the various features of example embodiments may vary. For example, a time for performing annealing may be changed.

According to example embodiments, a transistor may have a dual gate structure in which a bottom gate is under an active layer. A transistor according to example embodiments may include a multilayer channel structure. The transistor may be used in various devices, for example, a memory device and/or a logic device as well as a liquid crystal display device and/or an organic light emitting display device.

While example embodiments have been particularly shown and described, it will be understood by one of ordinary skill in the art that variations in form and detail may be made therein without departing from the spirit and scope of the claims.

What is claimed is:

1. A transistor, comprising:
   an oxide semiconductor layer including a source region, a drain region and a channel region, the channel region between the source and drain regions;
   a gate electrode on the channel region;
   a gate insulating layer between the channel region and the gate electrode, the gate insulating layer on the source region, the drain region, and the channel region; and
   insulating spacers on the gate insulating layer and on at least one surface of the gate electrode, the gate insulating layer being wider than a combined width of the gate electrode and the insulating spacers.

2. The transistor of claim 1, further comprising:
   an interlayer insulating layer on the oxide semiconductor layer, the gate insulating layer and the gate electrode; and
   first and second electrode layers on the interlayer insulating layer and respectively connected to the source and drain regions.

3. The transistor of claim 1, further comprising:
   a first electrode layer contacting the source region; and
   a second electrode layer contacting the drain region.

4. The transistor of claim 1, wherein the oxide semiconductor layer includes at least one of ZnO, SnO, InO, CdO, SrO, CuO, AlO, GaO, HfO, ZrO, NbO, SmO, GdO, DyO, BaO, TiO, CaO, TaO, LnO, NiO, YO, mixtures thereof, and oxides based thereon.

5. The transistor of claim 4, wherein the oxide semiconductor layer is a ZnO-based oxide.

6. The transistor of claim 5, wherein the ZnO-based oxide includes at least one of indium (In), gallium (Ga), aluminum (Al), titanium (Ti), tin (Sn), zirconium (Zr), hafnium (Hf), yttrium (Y), tantalum (Ta) and chromium (Cr).

7. The transistor of claim 1, wherein the source and drain regions include at least one conductive impurity.

8. The transistor of claim 7, wherein the at least one conductive impurity includes at least one of boron (B), boron difluoride ($BF_2$), aluminum (Al), gallium (Ga), indium (In) and antimony (Sb).

9. The transistor of claim 1, wherein at least a portion the gate insulating layer has a width greater than a width of the gate electrode and smaller than a width of the oxide semiconductor layer.

10. A transistor, comprising:
    an oxide semiconductor layer including a source region, a drain region and a channel region, the channel region between the source and drain regions;
    a gate electrode on the channel region;
    a gate insulating layer between the channel region and the gate electrode, the gate insulating layer on the source region, the drain region, and the channel region;
    a first electrode layer contacting the source region; and
    a second electrode layer contacting the drain region, the first and second electrodes contacting at least two sides of the gate insulating layer.

11. The transistor of claim 10, wherein the oxide semiconductor layer includes at least one of ZnO, SnO, InO, CdO, SrO, CuO, AlO, GaO, HfO, ZrO, NbO, SmO, GdO, DyO, BaO, TiO, CaO, TaO, LnO, NiO, YO, mixtures thereof, and oxides based thereon.

12. A method of manufacturing a transistor, the method comprising:
    forming an oxide semiconductor layer including a channel region;
    forming a gate insulating layer on the oxide semiconductor layer;
    forming a conductive layer on the gate insulating layer;
    patterning the conductive layer to form a gate electrode corresponding to the channel region and to expose the gate insulating layer adjacent to the gate electrode;
    forming source and drain regions in the oxide semiconductor layer adjacent to the gate electrode;
    forming insulating spacers on at least one side surface of the gate electrode; and
    etching the gate insulating layer by using the gate electrode and the insulating spacers as an etch mask.

13. The method of claim 12, wherein the oxide semiconductor layer includes at least one of ZnO, SnO, InO, CdO, SrO, CuO, AlO, GaO, HfO, ZrO, NbO, SmO, GdO, DyO, BaO, TiO, CaO, TaO, LnO, NiO, YO, mixtures thereof, and oxides based thereon.

14. The method of claim 13, wherein the oxide semiconductor layer includes a ZnO-based oxide.

15. The method of claim 14, wherein the ZnO-based oxide includes at least one of indium (In), gallium (Ga), aluminum (Al), titanium (Ti), tin (Sn), zirconium (Zr), hafnium (Hf), yttrium (Y), tantalum (Ta) and chromium (Cr).

16. The method of claim 12, wherein the forming of the source and drain regions includes injecting at least one conductive impurity into the oxide semiconductor layer through the gate insulating layer adjacent to the gate electrode.

17. The method of claim 16, wherein the at least one conductive impurity includes at least one of boron (B), boron difluoride ($BF_2$), aluminum (Al), gallium (Ga), indium (In) and antimony (Sb).

18. The method of claim 16, wherein the forming of the source and drain regions includes annealing the oxide semiconductor layer with the at least one conductive impurity at a temperature of less than or equal to about 400° C.

19. A method of manufacturing a transistor, the method comprising:
    forming an oxide semiconductor layer including a channel region;
    forming a gate insulating layer on the oxide semiconductor layer;
    forming a conductive layer on the gate insulating layer;
    patterning the conductive layer to form a gate electrode corresponding to the channel region and to expose the gate insulating layer adjacent to the gate electrode;
    forming source and drain regions in the oxide semiconductor layer adjacent to the gate electrode; and
    forming first and second electrode layers respectively contacting the source and drain regions, the first and second electrodes contacting at least two sides of the gate insulating layer.

20. The method of claim 19, wherein the oxide semiconductor layer includes at least one of ZnO, SnO, InO, CdO, SrO, CuO, AlO, GaO, HfO, ZrO, NbO, SmO, GdO, DyO, BaO, TiO, CaO, TaO, LnO, NiO, YO, mixtures thereof, and oxides based thereon.

* * * * *